United States Patent
Miura et al.

(10) Patent No.: US 10,670,819 B2
(45) Date of Patent: Jun. 2, 2020

(54) OPTICAL COUPLING STRUCTURE BETWEEN OPTICAL FIBER AND SEMICONDUCTOR LASER

(71) Applicant: FURUKAWA ELECTRIC CO., LTD., Tokyo (JP)

(72) Inventors: Masakazu Miura, Tokyo (JP); Jun Miyokawa, Tokyo (JP); Kazuki Yamaoka, Tokyo (JP); Hajime Mori, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 16/051,935

(22) Filed: Aug. 1, 2018

(65) Prior Publication Data
US 2018/0335593 A1 Nov. 22, 2018

Related U.S. Application Data

(63) Continuation of application No. PCT/JP2017/002261, filed on Jan. 24, 2017.

(30) Foreign Application Priority Data

Feb. 4, 2016 (JP) ................................ 2016-019495

(51) Int. Cl.
*G02B 6/42* (2006.01)
*G02B 6/26* (2006.01)
(Continued)

(52) U.S. Cl.
CPC .......... *G02B 6/4295* (2013.01); *G02B 6/262* (2013.01); *G02B 6/4296* (2013.01); *H01S 5/022* (2013.01);
(Continued)

(58) Field of Classification Search
CPC ....................................................... G02B 6/42
(Continued)

(56) References Cited

U.S. PATENT DOCUMENTS 4,592,059 A * 5/1986 Westermeier ............. H01S 5/02
257/713
5,852,696 A * 12/1998 Collins .................. G02B 6/423
385/88
(Continued)

FOREIGN PATENT DOCUMENTS

JP 55-044735 A 3/1980
JP S6066493 A 4/1985
(Continued)

OTHER PUBLICATIONS

International Search Report issued in PCT Patent Application No. PCT/JP2017/002261 dated Apr. 18, 2017.
(Continued)

*Primary Examiner* — Kaveh C Kianni
(74) *Attorney, Agent, or Firm* — Marshall, Gerstein & Borun LLP

(57) ABSTRACT

A non-plated region is formed in a certain range from an end of a submount. The non-plated region is a portion where a plating layer is not provided, and thus a substrate of the submount is exposed. An intermediate layer is formed on the plating layer. Furthermore, a plating layer is formed on the intermediate layer. A semiconductor laser is formed on the plating layer. The position of an end of the semiconductor laser substantially coincides with the position of an end of the plating layer (the intermediate layer). That is, even in a case where there is a deviation between an end face of the intermediate layer and an end face of the semiconductor
(Continued)

laser, the amount of this deviation is sufficiently smaller than the amount by which the intermediate layer is set back from an end face of the submount.

5 Claims, 7 Drawing Sheets

(51) Int. Cl.
  *H01S 5/022* (2006.01)
  *H01S 5/0683* (2006.01)
  *H01S 5/024* (2006.01)
(52) U.S. Cl.
  CPC ...... *H01S 5/02252* (2013.01); *H01S 5/02284* (2013.01); *G02B 6/4286* (2013.01); *H01S 5/02476* (2013.01); *H01S 5/0683* (2013.01)
(58) Field of Classification Search
  USPC .......................................................... 385/123
  See application file for complete search history.

(56) References Cited

U.S. PATENT DOCUMENTS

| | | | | |
|---|---|---|---|---|
| 2001/0017964 | A1* | 8/2001 | Setoguchi | G02B 6/421 385/88 |
| 2002/0063329 | A1* | 5/2002 | Horie | H01L 33/642 257/706 |
| 2002/0180944 | A1* | 12/2002 | Fujii | G03F 7/2053 355/70 |
| 2003/0174976 | A1* | 9/2003 | Fukuda | G02B 6/4201 385/93 |
| 2004/0017977 | A1* | 1/2004 | Lam | G02B 6/4204 385/49 |
| 2007/0278666 | A1* | 12/2007 | Garcia | G02B 6/4202 257/707 |
| 2011/0026558 | A1* | 2/2011 | Raju | G02B 6/423 372/50.1 |
| 2014/0369064 | A1* | 12/2014 | Sakaue | G02B 27/0994 362/553 |

FOREIGN PATENT DOCUMENTS

| | | |
|---|---|---|
| JP | S62169488 A | 7/1987 |
| JP | H05257042 A | 10/1993 |
| JP | 10-048479 | 2/1998 |
| JP | 2007258480 A | 10/2007 |
| JP | 2013-4752 A | 1/2013 |
| JP | 2016111240 A | 6/2016 |
| WO | WO-2013/073024 A1 | 5/2013 |

OTHER PUBLICATIONS

Decision to Grant issued in Japanese Patent Application No. 2016-019495 dated Feb. 4, 2020.

* cited by examiner

OPTICAL COUPLING STRUCTURE BETWEEN OPTICAL FIBER AND SEMICONDUCTOR LASER

TECHNICAL FIELD

The present disclosure relates to an optical coupling structure between an optical fiber and a semiconductor laser in a semiconductor laser module.

BACKGROUND

Semiconductor laser modules have been conventionally used for coupling light emitted from a semiconductor laser to an optical fiber. The semiconductor laser is fixed on a submount, and light emitted from the semiconductor laser is optically coupled with an optical fiber (Japanese Unexamined Patent Application Publication No. 2013-4752 (JP-A-2013-4752), for example).

FIG. 4A is a view showing a conventionally used submount material 100 and FIG. 4B is an enlarged view of a section X in FIG. 4A. The submount material is formed of aluminum nitride (AlN), for example, and a plating layer 101 is formed on a part of a surface thereof. The plating layer 101 is formed of an alloy such as gold-tin (AuSn) alloy or gold-nickel (AuNi) alloy and is used as solder for joining a semiconductor laser that is to be placed above.

Such the submount material 100 is used being cut into a plurality of parts. FIG. 5A is a view showing a state of the submount material 100 being cut, and FIG. 5B is an enlarged view of a section Y in FIG. 5A. The submount material 100 is extremely hard and thus a burr hardly occurs, whereas the plating layer 101 is a soft metal layer and thus a bur 103 may occur when being cut.

When such the burr 103 occurs, a problem in which the burr 103 obstructs a part of light emitted from the semiconductor laser may arise. Also, the burr may become an obstruction, which may deteriorate accuracy of placing of the semiconductor laser and, furthermore, may cause a problem of falling off of the burr. For these reasons, a method in which a burr does not occur when cutting the submount material 100 is required.

As a countermeasure, there is a method in which a non-plated region 105 is formed at a cutting part of the plating layer 101 as shown in FIG. 6A. Forming a non-plated region 105, so-called pullback, at the cutting part in this way can prevent a burr generated at the cutting part of the plating layer 101 as shown in FIG. 6B.

FIG. 7 is a view showing a state in which a semiconductor laser 111 is fixed on a submount 109 formed with such a pullback and the semiconductor laser 111 and an optical fiber 107 are optically coupled. As mentioned above, the non-plated region 105 is formed over a predetermined range from an end of the submount 109. That is, the plating layer 101 is a part other than the non-plated region 105 and is disposed at a position that is a predetermined distance away from the end of the submount 109.

An electrode layer 111a of the semiconductor laser 111 is fixed at a position that substantially coincides with the plating layer 101 on the submount 109. That is, the semiconductor laser 111 is fixed at a position that is a predetermined distance away from the end of the submount 109. Joining approximately the whole lower surface of the semiconductor laser 111 with the submount 109 (the plating layer 101) allows heat from the semiconductor laser 111 to efficiently transmit to the submount 109, and thus high cooling effects can be obtained.

On the other hand, to optically couple the semiconductor laser 111 and the optical fiber 107 directly, it is necessary that a tip end of the optical fiber 107 is close to the semiconductor laser 111. However, as mentioned above, since the semiconductor laser 111 is set back from the end of the submount 109, the optical fiber 107 may interfere with the submount 109 (Z in the drawing).

However, as mentioned above, if the electrode layer 111a of the semiconductor laser 111 is fixed so as to protrude from the plating layer 101, it is impossible to successfully transmit the heat from the semiconductor laser 111 to the submount 109. Thus, it is required that a position of the electrode layer 111a of the semiconductor laser 111 coincides with a position of the plating layer 101. Also, without forming the non-plated region 105, burrs may occur as mentioned above.

SUMMARY OF THE DISCLOSURE

The present disclosure was made in view of such problems. Its object is to provide an optical coupling structure between an optical fiber and a semiconductor laser, in which the semiconductor laser that is disposed on a submount having a pullback can be optically coupled with the optical fiber efficiently.

To achieve the above object, the presently disclosed embodiments include an optical coupling structure between an optical fiber and a semiconductor laser including a submount, a non-plated region that is formed in a certain range from an end of the submount, a plating layer that is formed on a part other than the non-plated region, an intermediate layer that is formed above the plating layer and disposed so as to be set back for a certain amount from the end of the submount, a semiconductor laser that is disposed on the intermediate layer, and a lensed fiber that is to be optically coupled with the semiconductor laser, in which a distance between the semiconductor laser and the lensed fiber is smaller than the amount of set back of the intermediate layer from an end face of the submount.

The semiconductor laser may be junction-down mounted, in which a light-emitting area of the semiconductor laser is disposed on a side of the intermediate layer.

The intermediate layer may be a component softer than the submount or the semiconductor laser.

In such a case, the intermediate layer may be made of copper.

A thickness of the intermediate layer may be 10 μm, or more of an outer diameter of the lensed fiber.

According to the presently contemplated embodiments, it is possible to prevent interference between the lensed fiber and the submount by disposing the intermediate layer on the submount to raise the semiconductor laser.

Such an effect is especially effective if the semiconductor laser is junction-down mounted, in which the light-emitting area of the semiconductor laser is disposed on an intermediate layer side.

Also, if the intermediate layer is made of a material softer than the submount or the semiconductor laser, it is possible to prevent applying a large stress to the semiconductor laser due to a difference in linear expansion coefficients between each of the components. That is, the intermediate layer can serve as a buffer layer.

Also, if the intermediate layer is made of copper, heat conductivity thereof is high and thus high cooling effects can be obtained.

Also, if the thickness of the intermediate layer is 10 μm or more, the interference between the lensed fiber and the submount can be prevented with more certainty.

The presently described embodiments can provide an optical coupling structure between an optical fiber and a semiconductor laser, in which the semiconductor laser disposed on a submount having a pullback can be optically coupled with the optical fiber efficiently.

DETAILED DESCRIPTION

Figure 1:
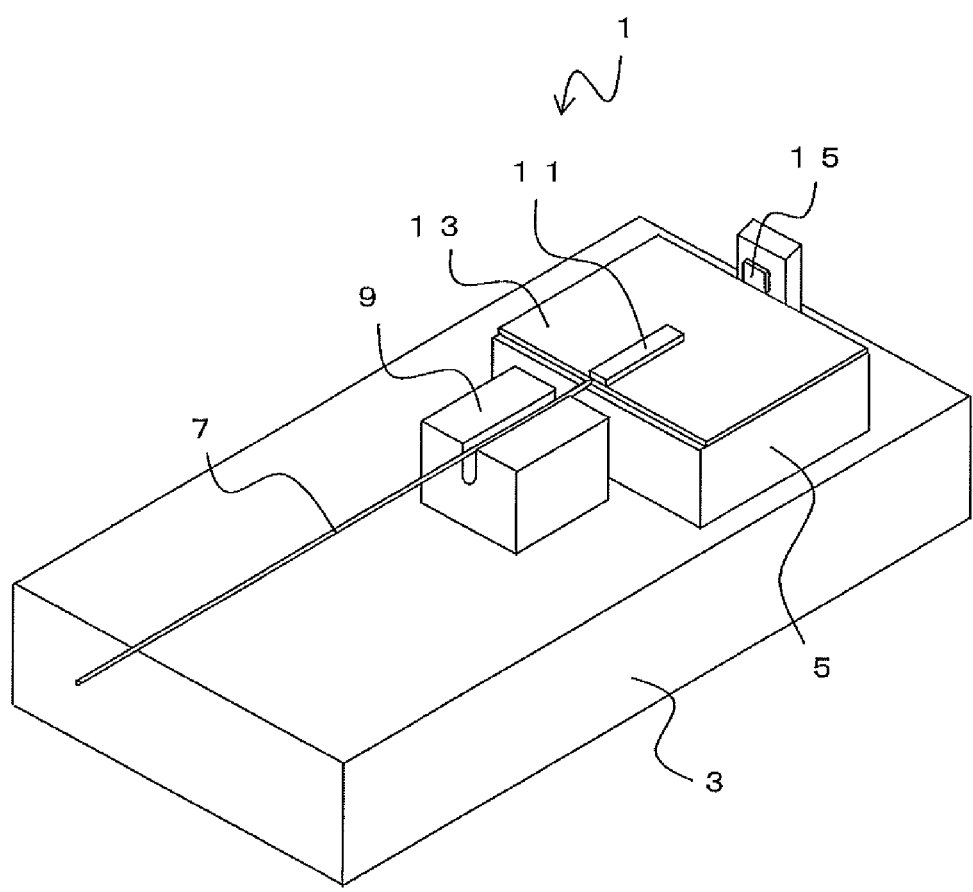
FIG. 1 is a perspective view showing a semiconductor laser module 1.

Hereinafter, an embodiment will be described with reference to the accompanying drawings. FIG. 1 is a perspective view showing a semiconductor laser module 1. Circuits or the like that are formed in each structure are omitted in the drawing. The semiconductor laser module 1 mainly includes a base 3, a submount 5, an optical fiber 7, a semiconductor laser 11, and so on.

The base 3 is disposed inside a package, an illustration of which is omitted in the drawing. Heat can be released by disposing a cooling device such as a Peltier element on a lower face of the base 3, or by contacting with a bottom plate of the package. The base 3 may be formed of a material such as ceramics, metal, resin, or glass.

The submount 5 and a fiber-fixing pedestal 9 are provided on the base 3. The fiber-fixing pedestal 9 is a pedestal on which the optical fiber 7 is fixed. Also, the semiconductor laser 11 is fixed on the submount 5. Each of the structures on the base 3 may be formed as an integrated body with the base 3.

The optical fiber 7 is a so-called lensed fiber, having a wedge-shaped tip. That is, the optical fiber 7 can be optically coupled with the semiconductor laser 11 directly without other lenses or the like in-between.

A photo-detector 15 is disposed at the rear of the semiconductor laser 11. The photo-detector 15 receives and monitors output light of the semiconductor laser 11. The photo-detector 15 is a photo-diode, for example.

The structure of the semiconductor laser module 1 is not limited to the illustrated example. For example, some parts of the illustrated structure may not be included, or other parts may be included in the structure. Size and arrangement of each component are also not limited to the illustrated example.

An intermediate layer 13 is formed in a certain range of an upper surface of the submount 5. That is, the semiconductor laser 11 is fixed on the submount 5 with the intermediate layer 13 in-between.

Figure 2:
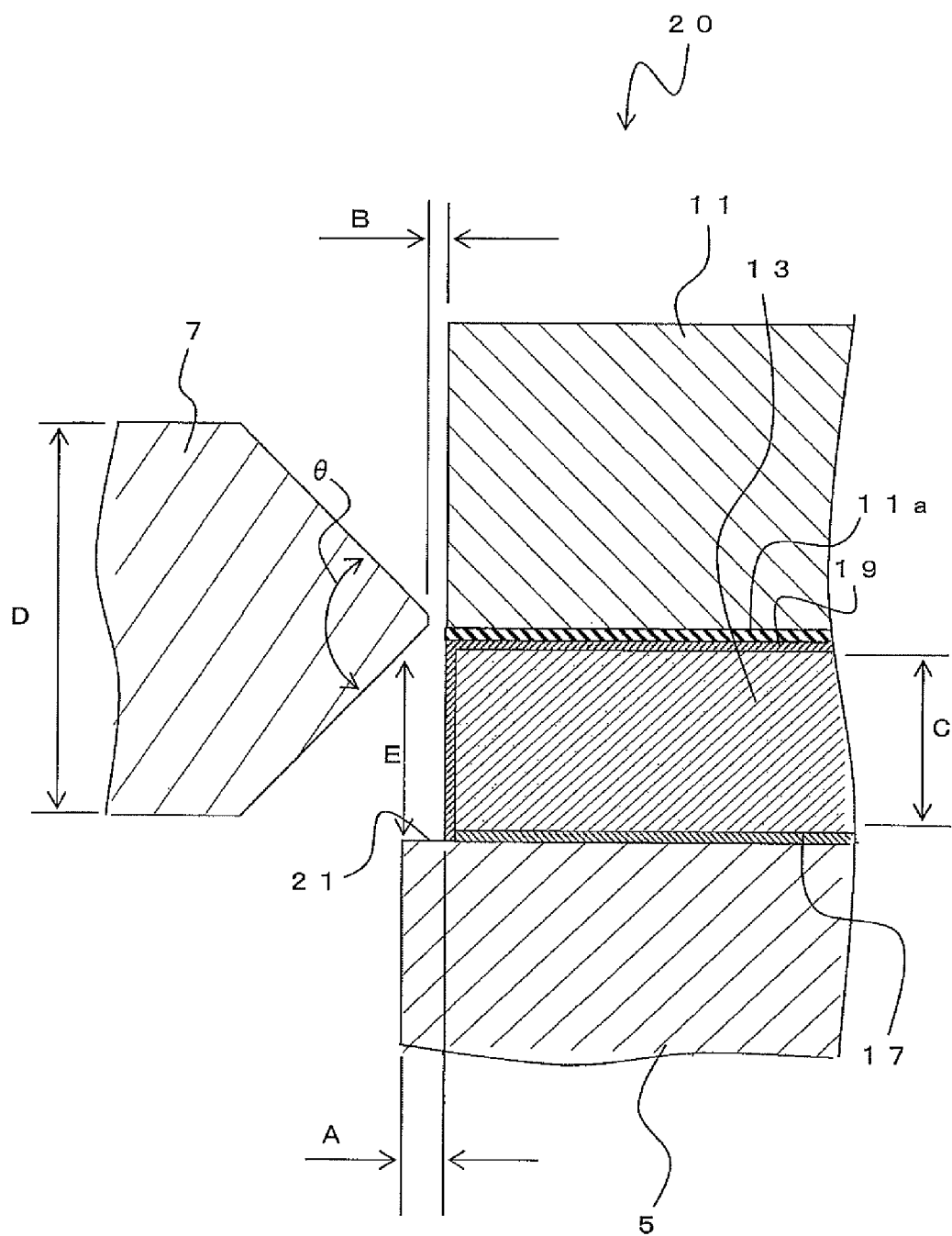
FIG. 2 is a view showing an optical coupling structure 20 between an optical fiber 7 and a semiconductor laser 11.

FIG. 2 is an enlarged cross-sectional view showing an optical coupling structure 20 between the optical fiber 7 and the semiconductor laser 11.

A non-plated region 21, called pullback, is formed in a certain range from an end of the submount 5. The non-plated region 21 is a part where a plating layer 17 is not provided and a base material of the submount 5 is exposed. Here, a part other than the non-plated region 21 is the plating layer 17. That is, the plating layer 17 is not formed in the proximity of the end of the submount 5, and the plating layer 17 is formed at a part that is a predetermined distance (A in the drawing) away from the end of the submount 5. For this reason, it is unlikely that a large burr of the plating layer 17 is formed in the proximity of the above-mentioned cutting part of the submount material (the end of the submount 5).

The plating layer 17 is either of gold plating, nickel plating, gold-nickel plating, or gold-tin plating, for example, and serves as a joining part with the intermediate layer 13 above. That is, the intermediate layer 13 is formed on the plating layer 17. Also, a plating layer 19 is formed on the intermediate layer 13. The plating layer 19 is gold plating or gold-tin plating, for example, and serves as a joining part with the semiconductor laser 11 above. That is, the semiconductor laser 11 is formed on the plating layer 19 (the intermediate layer 13).

Here, the intermediate layer 13 may be formed on the plating layer 17 as plating, or a different component can be stuck onto the plating layer 17. Positions of the ends (positions of ends on an optical fiber 7 side) of the plating layer 17, the intermediate layer 13, and the plating layer 19 are formed substantially at the same place. That is, the intermediate layer 13 and the plating layer 19 do not protrude onto the non-plated region 21, and the intermediate layer 13 and the plating layer 19 are disposed so as to set back for a predetermined amount from the end of the submount 5.

Also, as mentioned above, the end position of the electrode layer 11a of the semiconductor laser 11 coincides with the end position of the plating layer 19 (the intermediate layer 13). That is, even if there is a deviation between an end face of the intermediate layer 13 and an end face of the semiconductor laser 11, this amount of the deviation is sufficiently smaller than the amount by which the intermediate layer 13 is set back from the end face of the submount 5 (A in the drawing). In this way, heat from the semiconductor laser 11 can be efficiently transmitted to the intermediate layer 13.

As mentioned above, since the optical fiber 7 is optically coupled with the semiconductor laser 11 directly, it is necessary to bring the optical fiber 7 closer to the semiconductor laser 11 than a predetermined distance. For example, the distance between the optical fiber 7 and the semiconductor laser 11 (B in the drawing) is approximately 5 μm. The distance between the optical fiber 7 and the semiconductor laser 11 (B in the drawing) is smaller than the amount by which the intermediate layer 13, or the plating layer 17, is set back from the end face of the submount 5 (A in the drawing).

A layout of the semiconductor laser 11 is preferably a junction-down mounted. That is, the semiconductor laser 11 is disposed so that a light-emitting part of the semiconductor laser 11 is on a lower side (on a side of the submount). In this way, heat from the semiconductor laser 11 can be efficiently transmitted downward and released.

When the light-emitting part of the semiconductor laser 11 is at the lower side thereof as shown, the optical fiber 7, with which the semiconductor laser 11 is optically coupled, is disposed so that a center thereof is at a side of the lower part of the semiconductor laser 11.

Here, though it is not specifically limited, material for the intermediate layer 13 is preferably softer than that for the semiconductor laser 11 and the submount 5. For example, if the semiconductor laser 11 is made of gallium arsenide (GaAs) and the submount is made of aluminum nitride (AlN) or copper-tungsten (CuW), the material for the intermediate layer 13 is preferably a soft metal such as copper (pure copper or copper alloy).

As above, by using soft material for the intermediate layer 13, the intermediate layer 13 can serve as a buffer layer against a stress caused by a difference between linear expansion coefficients of the semiconductor laser 11, the intermediate laser 13, and the submount 5, which can reduce a thermal stress applied onto the semiconductor laser 11. Particularly, if the intermediate layer 13 is made of copper, heat from the semiconductor laser 11 can be efficiently transmitted downward to the submount 5.

Next, a thickness of the intermediate layer 13 (C in the drawing) will be described. The thickness of the intermediate layer 13 is determined so as to secure a distance between the optical fiber 7 and the submount 5 (E in the drawing). That is, the intermediate layer 13 can prevent the optical fiber 7 from interfering with the submount 5.

Figure 3:
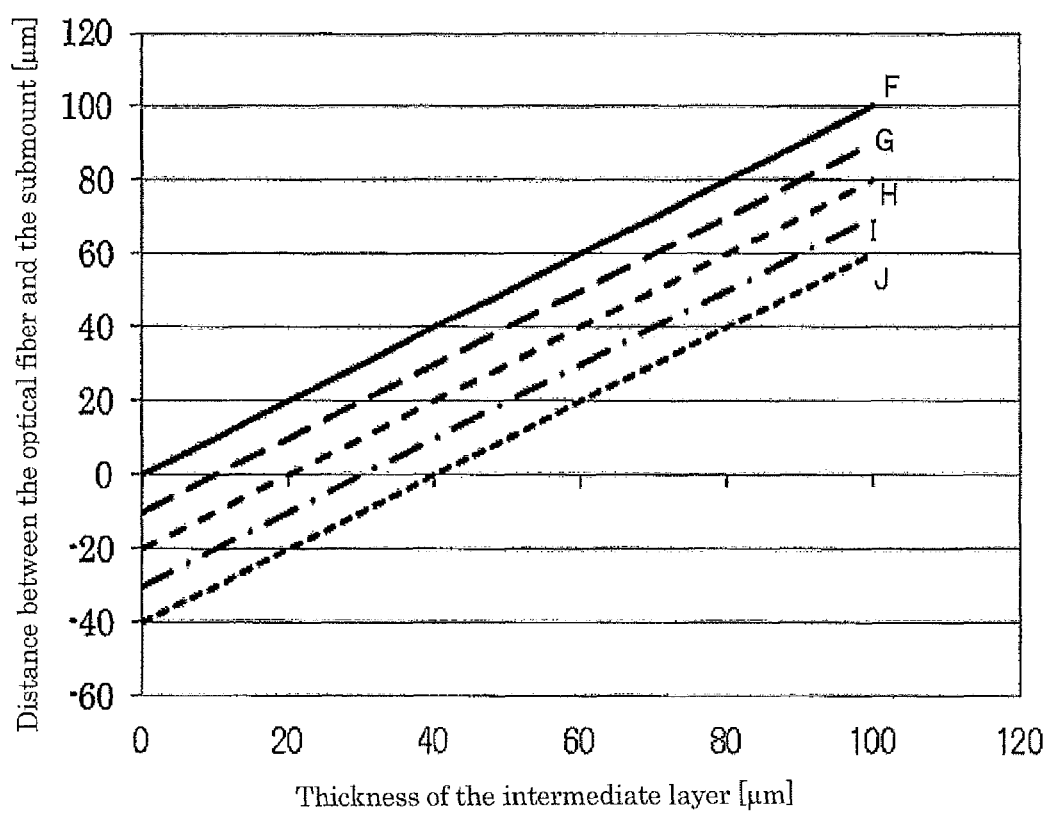
FIG. 3 is a graph showing calculated results of distances between an optical fiber and a submount.
Figure 4A:
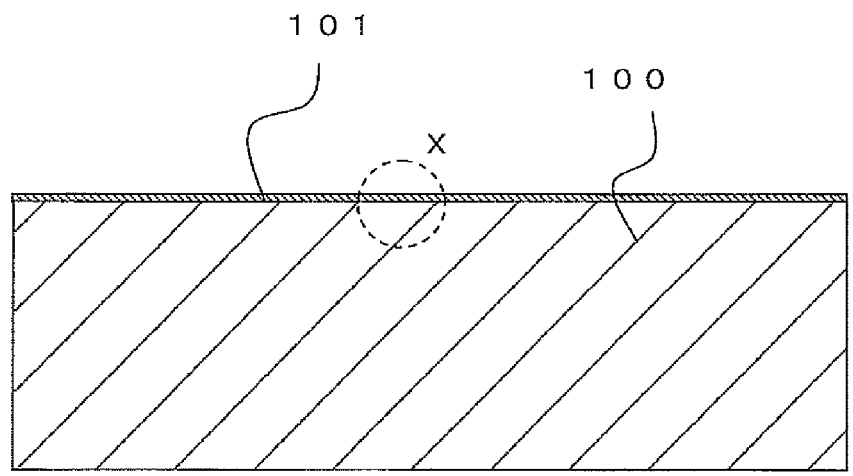
FIG. 4A is a view showing a conventional submount material 100.
Figure 4B:
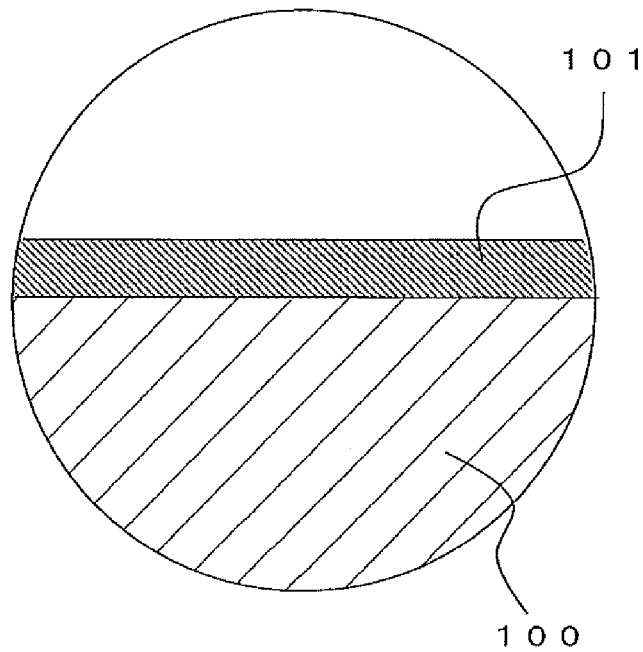
FIG. 4B is a view showing the conventional submount material 100 and is an enlarged view of a section X in FIG. 4A.
Figure 5A:
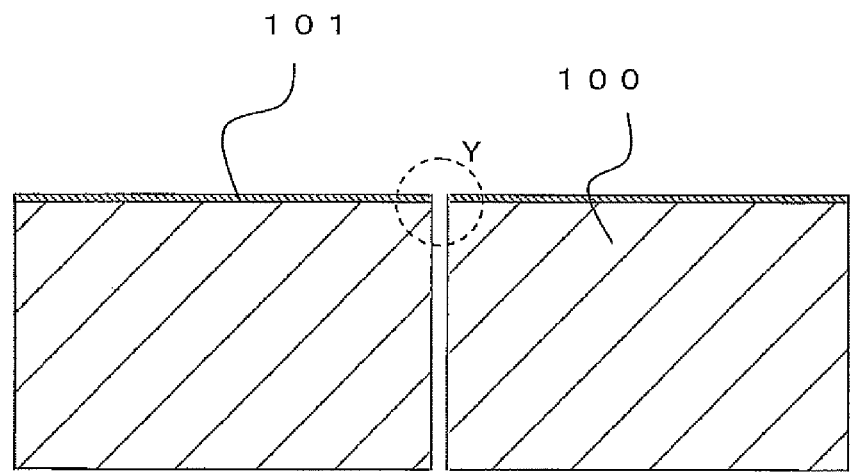
FIG. 5A is a view showing a state in which the conventional submount material 100 is cut.
Figure 5B:
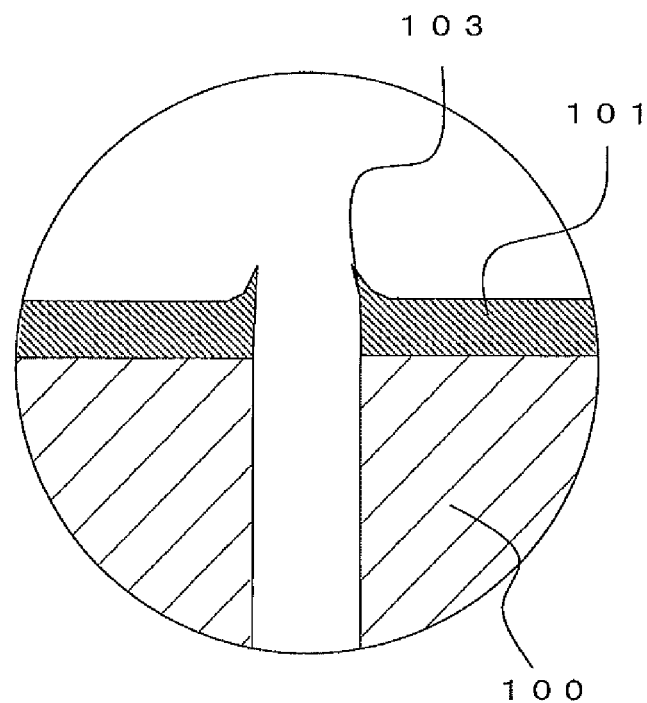
FIG. 5B is a view showing the conventional submount material 100 and is an enlarged view of a section Y in FIG. 5A.
Figure 6A:
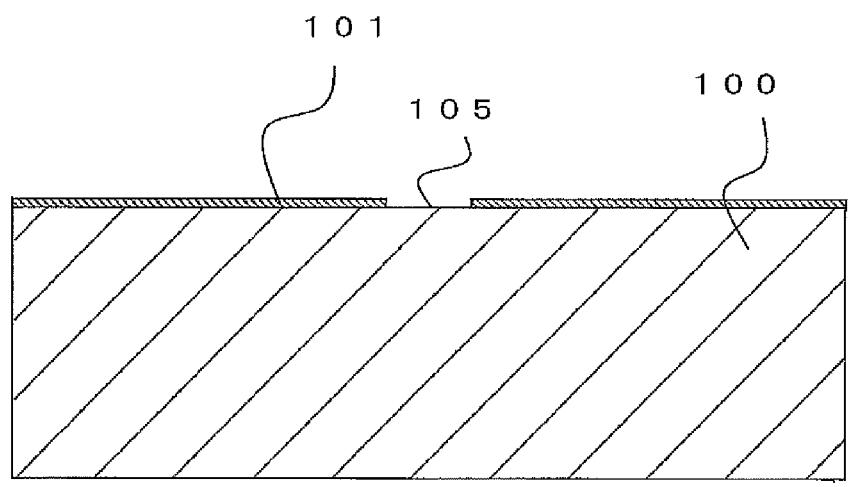
FIG. 6A is a view showing the conventional submount material 100 having a non-plated region 105.
Figure 6B:
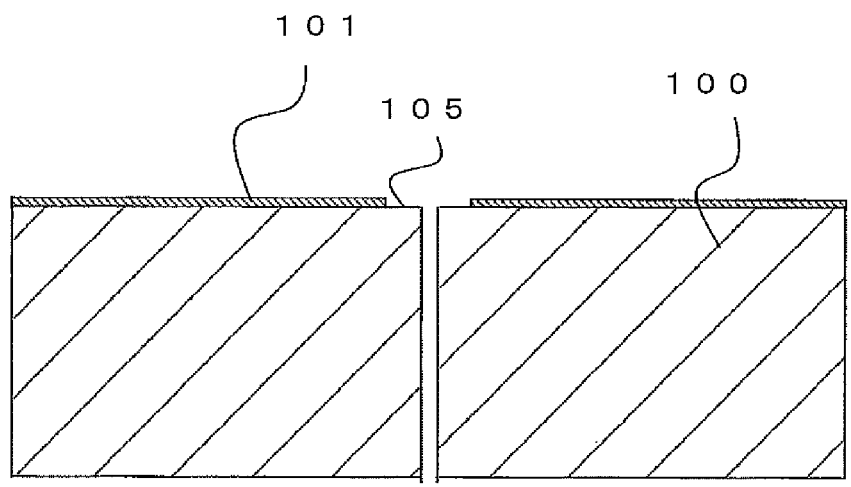
FIG. 6B is a view showing a state in which the conventional submount material 100 in FIG. 6A is cut.
Figure 7:
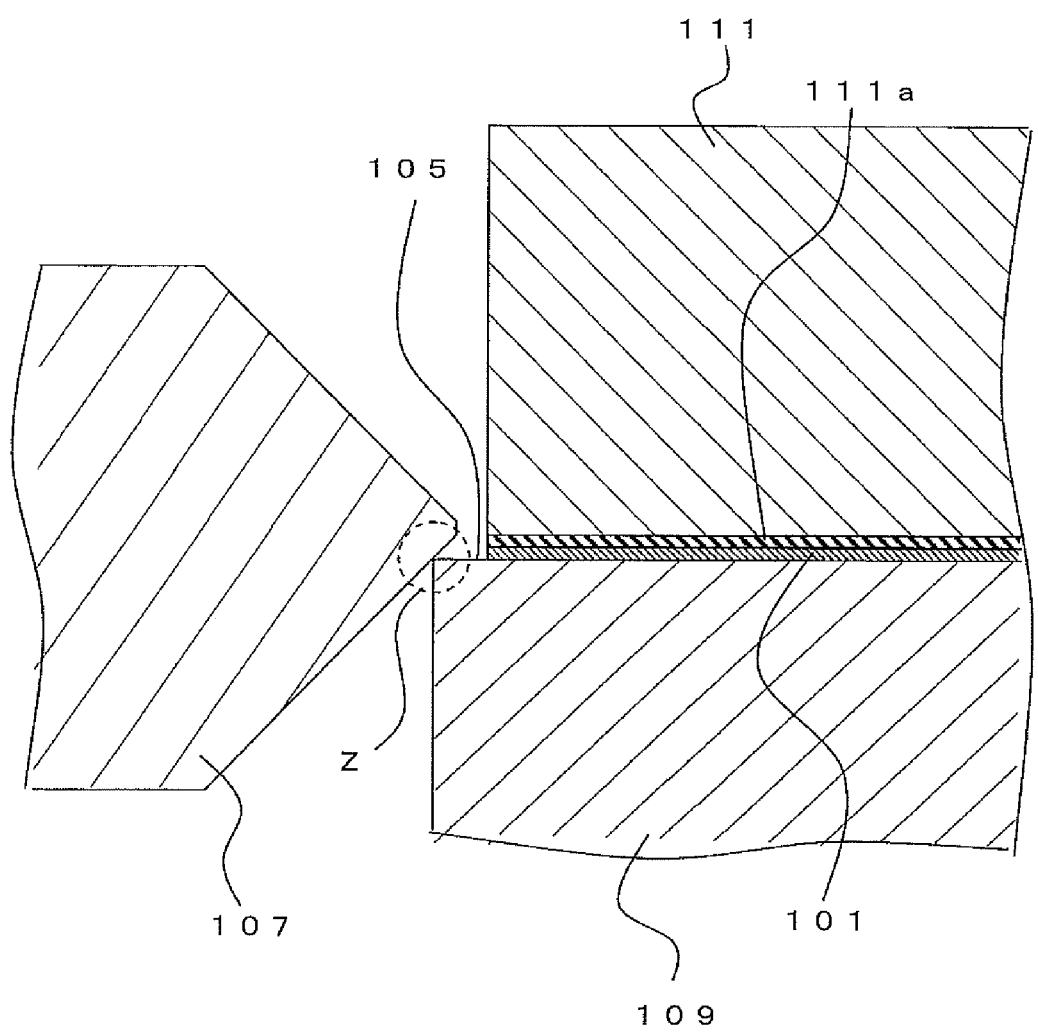
FIG. 7 is a view showing a conventional optical coupling structure between an optical fiber 107 and a semiconductor laser 111.

FIG. 3 is a graph showing a profile of calculated results of the distance between the optical fiber 7 and the submount 5 (E in FIG. 2) versus the thickness of the intermediate layer 13 (C in FIG. 2). An angle of opening of the tip of the optical fiber 7 (8 in FIG. 2) is 90°. Also, the distance between the optical fiber 7 and the semiconductor laser 11 (B in FIG. 2) is 5 μm and a thickness of the plating layer 17 is 5 μm.

F in the drawing is the calculated result in a case when the amount of set back of the intermediate layer 13 (A in FIG. 2) is 10 μm, G in the drawing is the calculated result in a case when the amount of set back of the intermediate layer 13 (A in FIG. 2) is 20 μm, H in the drawing is the calculated result in a case when the amount of set back of the intermediate layer 13 (A in FIG. 2) is 30 μm, I in the drawing is the calculated result in a case when the amount of set back of the intermediate layer 13 (A in FIG. 2) is 40 μm, and J in the drawing is the calculated result in a case when the amount of set back of the intermediate layer 13 (A in FIG. 2) is 50 μm.

Under a condition in which the distance between the optical fiber 7 and the submount 5 (E in FIG. 2) of the vertical axis is zero or less, the optical fiber 7 is in contact with the submount 5 (i.e. it is impossible to bring the optical fiber 7 any closer toward the semiconductor laser 11). Thus, it is necessary to determine the thickness of the intermediate layer 13 so that the distance between the optical fiber 7 and the submount 5 (E in FIG. 2) of the vertical axis is more than zero.

For example, if the amount of set back of the intermediate layer 13 is set around commonly used 20 μm, the thickness of the intermediate layer 13 is required to be approximately 10 μm or more. That is, if the thickness of the intermediate layer (C in FIG. 2) is 10 μm or more, it is possible to prevent the optical fiber 7 from contacting with the submount 5.

If the thickness of the intermediate layer 13 (C in FIG. 2) is half or more of an outer diameter of the optical fiber 7 (D in FIG. 2), then it is possible to prevent the optical fiber 7 from contacting with the submount 5, regardless of the amount of set back of the intermediate layer 13 (A in FIG. 2).

As above, based on positional relationships between the optical fiber 7, the submount 5, the intermediate layer 13, the semiconductor laser 11, the plating layer 17 and 19, and the like, the thickness of the intermediate layer 13 is determined so that the distance between the optical fiber 7 and the submount 5 is approximately 10 μm, for example. This can prevent the optical fiber 7 from contacting with the submount 5 even at a time of alignment of the optical fiber 7.

As described above, according to the present embodiment, disposing the intermediate layer 13 on the submount 5 and fixing the semiconductor laser 11 on the intermediate layer 13 can raise the semiconductor laser 11 to prevent interference between the optical fiber 7 and the submount 5.

Particularly, if the semiconductor laser 11 is junction-down mounted with a light-emitting area thereof being at the lower part (on the side of the intermediate layer 13), the optical fiber 7 is close to the submount 5 and thus interference between the optical fiber 7 and the submount 5 can be more effectively prevented.

Also, by using a softer material than the submount 5 or the like, the intermediate layer 13 can serve as a buffer layer against the thermal stress caused by the difference between linear expansion coefficients of each component. Thus, the semiconductor laser 11 can be prevented from getting an excess stress.

Particularly, if the intermediate layer 13 is made of copper, heat from the semiconductor laser 11 can be efficiently transmitted to the submount 5.

Also, the thickness of the intermediate layer 13 is determined accordingly to prevent interference between the optical fiber 7 and the submount 5. However, if the thickness of the intermediate layer 13 is 10 μm or more, it is generally possible to prevent the optical fiber 7 from contacting with the submount 5. Furthermore, if the thickness of the intermediate layer 13 is half or more of the outer diameter of the optical fiber 7, it is possible to prevent the optical fiber 7 from contacting with the submount 5 with certainty.

Although the embodiments have been described based on typical sizes referring to the attached drawings, the technical scope is not limited to the embodiments described above. It is obvious that persons skilled in the art can think out various examples of changes or modifications within the scope of the technical idea recited in the claims, and it will be understood that they naturally belong to the technical scope of the presently contemplated embodiments.

For example, the shape of the optical fiber 7 is not limited to the illustrated example. For example, the tip shape of the optical fiber 7 may be any of a spherical shape, a non-spherical shape, a plane shape, or the like. Also, the intermediate layer 13 is not limited to have the one-layer structure, but may have a plural-layered structure.

What is claimed is:

1. An optical coupling structure between an optical fiber and a semiconductor laser comprising:
    a submount that is provided on a base;
    a fiber-fixing pedestal provided on the base;
    a non-plated region of the submount, the non-plated region extending from an end face of the submount;
    a plating layer formed on a part of the submount other than the non-plated region;

an intermediate layer that is formed on the plating layer and disposed such that an end of the intermediate layer is set back from the end face of the submount by a distance, A;

a semiconductor laser that is disposed on the intermediate layer; and a lensed fiber that is to be optically coupled with the semiconductor laser, the lensed fiber extending from the fiber-fixing pedestal, over a space between the fiber-fixing pedestal and the submount, and over the non-plated region of the submount wherein:

a distance, B, between the semiconductor laser and the lensed fiber is smaller than the distance, A, between the end of the intermediate layer and the end face of the submount.

2. The optical coupling structure between an optical fiber and a semiconductor laser according to claim 1, wherein:

the semiconductor laser is junction-down mounted, in which a light-emitting area of the semiconductor laser is disposed on a side of the intermediate layer.

3. The optical coupling structure between an optical fiber and a semiconductor laser according to claim 1, wherein:

the intermediate layer is a component softer than the submount or the semiconductor laser.

4. The optical coupling structure between an optical fiber and a semiconductor laser according to claim 3, wherein:

the intermediate layer is made of copper.

5. The optical coupling structure between an optical fiber and a semiconductor laser according to claim 1, wherein:

a thickness of the intermediate layer is 10 pm or more.

* * * * *